US010051584B2

(12) United States Patent
Gross et al.

(10) Patent No.: US 10,051,584 B2
(45) Date of Patent: Aug. 14, 2018

(54) APPARATUSES AND METHODS FOR TRANSMITTING A TRANSMIT SIGNAL COMPRISING A FIRST SIGNAL PORTION AND A SECOND SIGNAL PORTION

(71) Applicant: Intel IP Corporation, Santa Clara, CA (US)

(72) Inventors: Shahar Gross, Nes-Tziona (IL); Ran Shimon, Ramat Gan (IL); Roy Amel, Haifa (IL); Ofer Benjamin, Petach-Tikva (IL); Slava Vaysman, Nazareth Illit (IL)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 15/828,455

(22) Filed: Dec. 1, 2017

(65) Prior Publication Data

US 2018/0192379 A1    Jul. 5, 2018

(30) Foreign Application Priority Data

Jan. 2, 2017  (EP) .................................. 17150025

(51) Int. Cl.
*H04B 1/04*  (2006.01)
*H04W 52/52*  (2009.01)
(Continued)

(52) U.S. Cl.
CPC .......... *H04W 52/52* (2013.01); *H04B 1/0475* (2013.01); *H04B 17/13* (2015.01); *H04W 52/08* (2013.01); *H04B 2001/0416* (2013.01)

(58) Field of Classification Search
CPC ...... H04W 52/52; H04W 52/08; H04B 17/43; H04B 1/0475
(Continued)

(56) References Cited

U.S. PATENT DOCUMENTS

2003/0069049 A1\*  4/2003  Poranen ............... H03G 3/3047
                                                         455/572
2003/0114180 A1   6/2003  Black et al.
(Continued)

FOREIGN PATENT DOCUMENTS

EP           1739871 A2     1/2007

*Primary Examiner* — Sanh Phu
(74) *Attorney, Agent, or Firm* — 2SPL Patentanwaelte PartG mbB; Mani Arabi (57) ABSTRACT

The present disclosure relates to a transmitter for transmitting a transmit signal comprising a first signal portion and a second signal portion. The transmitter comprises a power amplifier configured to amplify the transmit signal. The power amplifier is prone to undesired gain variations during the first and the second signal portion. The transmitter further comprises a transmit feedback receiver coupled to an output of the power amplifier and configured to feed back the transmit signal to generate a fed back first signal portion and a fed back second signal portion. Processing circuitry is configured to determine a first gain relation between the fed back first signal portion and the first signal portion and to determine at least one second gain relation between the fed back second signal portion and the second signal portion. Power adjustment circuitry is configured to adjust a transmit power of the transmit signal according to a variation between the first gain relation and the second gain relation.

20 Claims, 7 Drawing Sheets

(51) Int. Cl.
*H04W 52/08* (2009.01)
*H04B 17/13* (2015.01)

(58) Field of Classification Search
USPC .................................................. 455/127.2
See application file for complete search history.

(56) References Cited

U.S. PATENT DOCUMENTS

| | | | | |
|---|---|---|---|---|
| 2004/0083409 | A1* | 4/2004 | Rozenblit | H03F 1/0211 |
| | | | | 714/48 |
| 2007/0184792 | A1* | 8/2007 | Drogi | H03F 1/0205 |
| | | | | 455/127.1 |
| 2009/0081968 | A1* | 3/2009 | Vinayak | H03F 1/0222 |
| | | | | 455/110 |
| 2010/0194476 | A1* | 8/2010 | Drogi | H03F 1/0227 |
| | | | | 330/252 |
| 2014/0213196 | A1* | 7/2014 | Langer | H03F 3/189 |
| | | | | 455/73 |

* cited by examiner

APPARATUSES AND METHODS FOR TRANSMITTING A TRANSMIT SIGNAL COMPRISING A FIRST SIGNAL PORTION AND A SECOND SIGNAL PORTION

FIELD

The present disclosure generally relates to wireless communication systems and, more particularly, to methods and apparatuses for leveling out undesired gain variations in a transmit signal.

BACKGROUND

Typical transmitter (TX) circuits used for wireline or wireless communications typically comprise digital and analog transmit circuitry. An integral part of most analog transmit circuitry is an analog Power Amplifier (PA). During transmission of data packets, an analog gain of the PA can vary undesirably over a packet time duration, for example, due to physical phenomena, such as temperature variations of circuit components. On a receiving (RX) end, channel estimation can be performed using a packet header of transmitted data packets, wherein the packet header comprises pilot or training symbols. In the 802.11 Wi-Fi standards such training symbols are also referred to as Short Training Field (STF) or Long Training Field (LTF), for example. Any gain variation of the transmitter's PA throughout the packet duration can then cause inaccurate gain estimation and thus limit the performance of a digital radio transmitter or receiver. This performance can be quantified by a measure called Error Vector Magnitude (EVM), for example. This can be critical in products which are required to reach an outstanding EVM (e.g., −35 dB and better), which is already a common requirement for many wireless systems, such as, for example, the 802.11ax Wi-Fi standard supporting up to 1024QAM (Quadrature Amplitude Modulation), which creates the need for receivers to reach an EVM of around −40 dB in Multiple-Input Multiple-Output (MIMO) scenarios.

Thus, there is a need for improving a transmitted signal quality, while at the same time enabling relaxed Radio Frequency (RF) designs.

BRIEF DESCRIPTION OF THE DRAWINGS

Some examples of apparatuses and/or methods will be described in the following by way of example only, and with reference to the accompanying figures, in which.

DESCRIPTION OF EMBODIMENTS

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B. An alternative wording for the same combinations is "at least one of A and B". The same applies for combinations of more than 2 Elements.

The terminology used herein for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality.

Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Examples of the present disclosure propose closed-loop transmitter (TX) gain tracking at the transmitter side of a communication link to improve transmitted signal quality, while at the same time enabling relaxed RF design considerations. TX gain tracking can be performed using a transmitter FeedBack Receiver (TX FBR). Thereby a TX FBR can be an existing component in multiple existing RF transceivers for purposes like closed-loop Transmission Power Control (TPC) and/or TX calibration. Thus, a TX FBR can receive a fed back version of a transmit signal from the transmitter portion of the transceiver. For that purpose, the TX FBR is coupled to the transmitter for feedback—unlike a main receiver of the device. A TX FBR can comprise a full RF receiver chain starting from getting analog RF signals until generating final digitalized Inphase and Quadrature (IQ) data streams.

Figure 1:
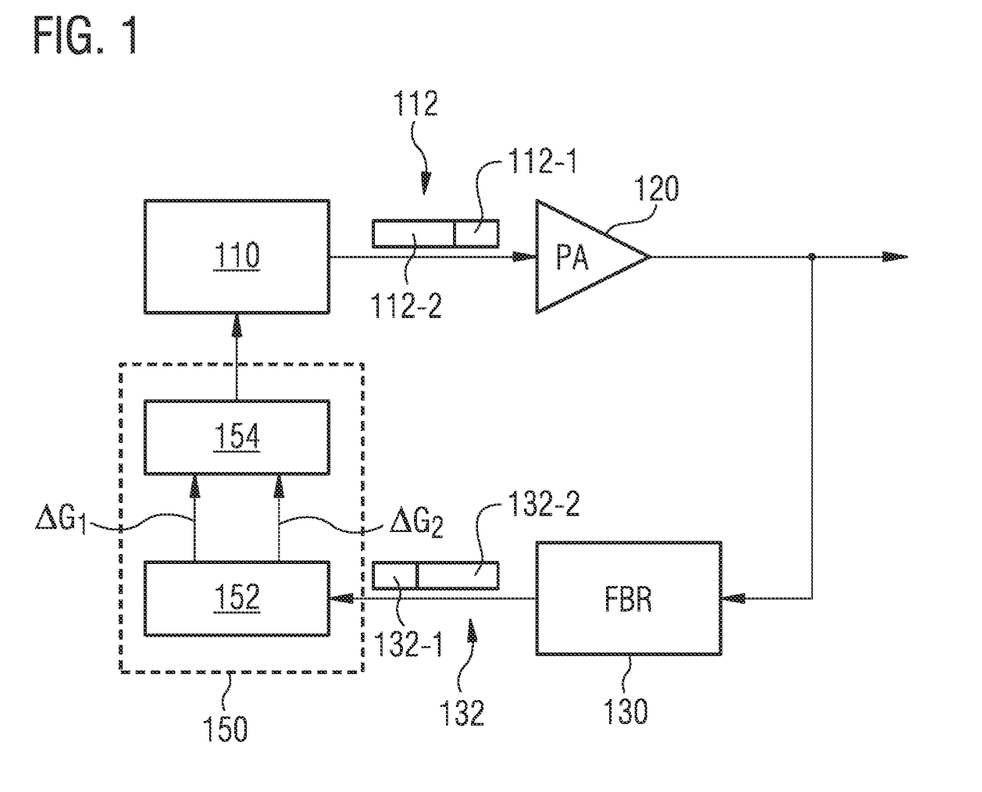
FIG. 1 shows a schematic block diagram of a transmitter for transmitting a transmit signal comprising a first signal portion and a second signal portion according to an example of the present disclosure.

FIG. 1 shows a block diagram of a transmitter device 100 suitable for transmitting a transmit signal 112 comprising a first signal portion 112-1 and a second signal portion 112-2.

Transmitter 100 comprises a PA 120 which is configured to amplify the transmit signal 112 coming from TX front end circuitry 110. PA 120 is prone to undesired gain variations affecting the subsequent first and second signal portions 112-1, 112-2 differently. Transmitter 100 further comprises a transmit feedback receiver (TX FBR) 130 which is coupled to an output of the PA 120 and is configured to feed back the transmit signal 112 to generate a fed back transmit signal 132 with a fed back first signal portion 132-1 and a fed back second signal portion 132-2. Transmitter 100 further comprises processing circuitry 152 which is configured to determine a first gain relation or difference $G_1$ between the fed back first signal portion 132-1 and the first signal portion 112-1 and to determine at least one second gain relation or difference $G_2$ between the fed back second signal portion 132-2 and the second signal portion 112-2. Power adjustment circuitry 154 of transmitter 100 is configured to adjust a power of the transmit signal 112 according to a variation $\Delta G$ between the first gain relation $G_1$ and the second gain relation $G_2$. The power adjustment can be done to level out undesired gain variations of the PA 120 between the first and first and second signal portions 112-1, 112-2.

The power adjustment to level the first and second gain relations can be done by adjusting an instantaneous gain of the PA 120 or by adjusting an instantaneous power or amplitude of the transmit signal 112 upstream to the PA 120. Thereby "upstream" denotes signals or circuitry before the PA 120 in the signal flow. While adjusting an instantaneous power or amplitude of the transmit signal 112 could also be done in the analog domain in some examples, it can be beneficial to perform this in the digital domain.

The skilled person will appreciate that transmitter 100 can comprise baseband as well as RF circuitry, including digital and/or analog TX filters, Digital-to-Analog Converters (DACs), one or more local oscillator circuits, one or more power amplifier (PA) circuits 120, one or more matching networks, and the like. Likewise, TX FBR circuitry 130 can comprise RF circuitry as well as baseband circuitry, including digital and/or analog RX filters, one or more local oscillator circuits, one or more Low Noise Amplifier (LNA) circuits, Analog-to-Digital Converter (ADCs), and the like.

Transmitter 100 can be employed in a User Equipment (UE) or mobile terminal used by an end-user to communicate. It can be a hand-held telephone, such as a smartphone, a laptop computer equipped with a mobile broadband adapter, or any other device. It can connect to base stations or NodeB/eNodeB's and/or to Wi-Fi/WiMAX access points, for example. In other examples, transmitter 100 can also be implemented in a base station or Wi-Fi/WiMAX access point.

In some examples, transmitter 100 or TX front end circuitry 110 can further comprise a Digital-to-Analog Converter (DAC) configured to digital-to-analog convert a digital transmit signal to an analog transmit signal. The PA 120 can be configured to amplify the analog transmit signal to generate a power amplified transmit signal. The transmit feedback receiver 130 can comprise an Analog-to-Digital Converter (ADC) configured to analog-to-digital convert the transmit signal fed back from the power amplifier 120 to a fed back digital transmit signal.

In some examples, processing circuitry 152 can comprise digital baseband circuitry configured to determine the first and the second gain relations $G_1$, $G_2$ based on digital baseband samples of the digital transmit signal and the fed back digital transmit signal (which can also be referred to as received signal).

In some examples, the first signal portion 112-1 of the transmit signal 112 can comprise one or more training symbols and the second signal portion 112-2 of the transmit signal 102 can comprise one or more payload symbols. For example, the transmit signal 112 may comprise data packets and the first signal portion 112-1 may correspond to a header/preamble portion of a data packet, while the second signal portion 112-2 may correspond to a payload portion of the data packet. Processing circuitry 152 can comprise digital baseband circuitry and can be configured to determine the first gain relation $G_1$ by relating a symbol power of a transmitted (digital) training symbol to a symbol power of a fed back (digital) training symbol and to determine the second gain relation $G_2$ by relating a symbol power of a (transmitted digital) payload symbol to a symbol power of a corresponding fed back (digital) payload symbol. By adjusting the instantaneous power of a digital transmit signal upstream to the PA 120 highly accurate results with respect to EVM can be achieved.

In some examples, the processing circuitry 152 or digital baseband circuitry thereof can be configured to determine the respective symbol powers by averaging corresponding digital baseband samples over a symbol duration $T_{sym}$.

In some examples, transmitter 100 or TX front end circuitry 110 can further comprise a modulator which is configured to modulate the transmit signal 112 according to a modulation scheme with a higher order symbol alphabet, for example, with a symbol alphabet of $M \geq 64$, $M \geq 256$ or $M \geq 1024$ symbols. Applying the proposed concept to higher order modulated signals with close proximity between adjacent constellation points may be particularly beneficial.

In some examples, a transmit symbol of the transmit signal 112 can comprise a cyclic prefix and the transmitter 100 can be configured for a signal propagation delay of the transmit signal from the TX front end circuitry 110 to the transmit feedback receiver 130 which is smaller than a duration of the cyclic prefix $T_{CP}$. This can be achieved with proper hardware design adapted to the duration of the cyclic prefix $T_{CP}$ or by adapting $T_{CP}$ to the hardware design.

In some examples, the transmitter 100 can be configured to transmit the transmit signal 102 as an Orthogonal Frequency-Division Multiplexing (OFDM) signal. OFDM is employed in the 802.11 standards or Long Term Evolution (LTE), for example.

In some examples, processing circuitry 152 can further optionally be configured to adjust parameters of a parametric gain model based on the determined first and the second signal gain values. The power adjustment circuitry 154 can be configured to adjust the transmit power of the transmit signal based on the parametric gain model. This option may be beneficial in scenarios where it is possible to derive a parametric gain model with high accuracy.

Figure 2:
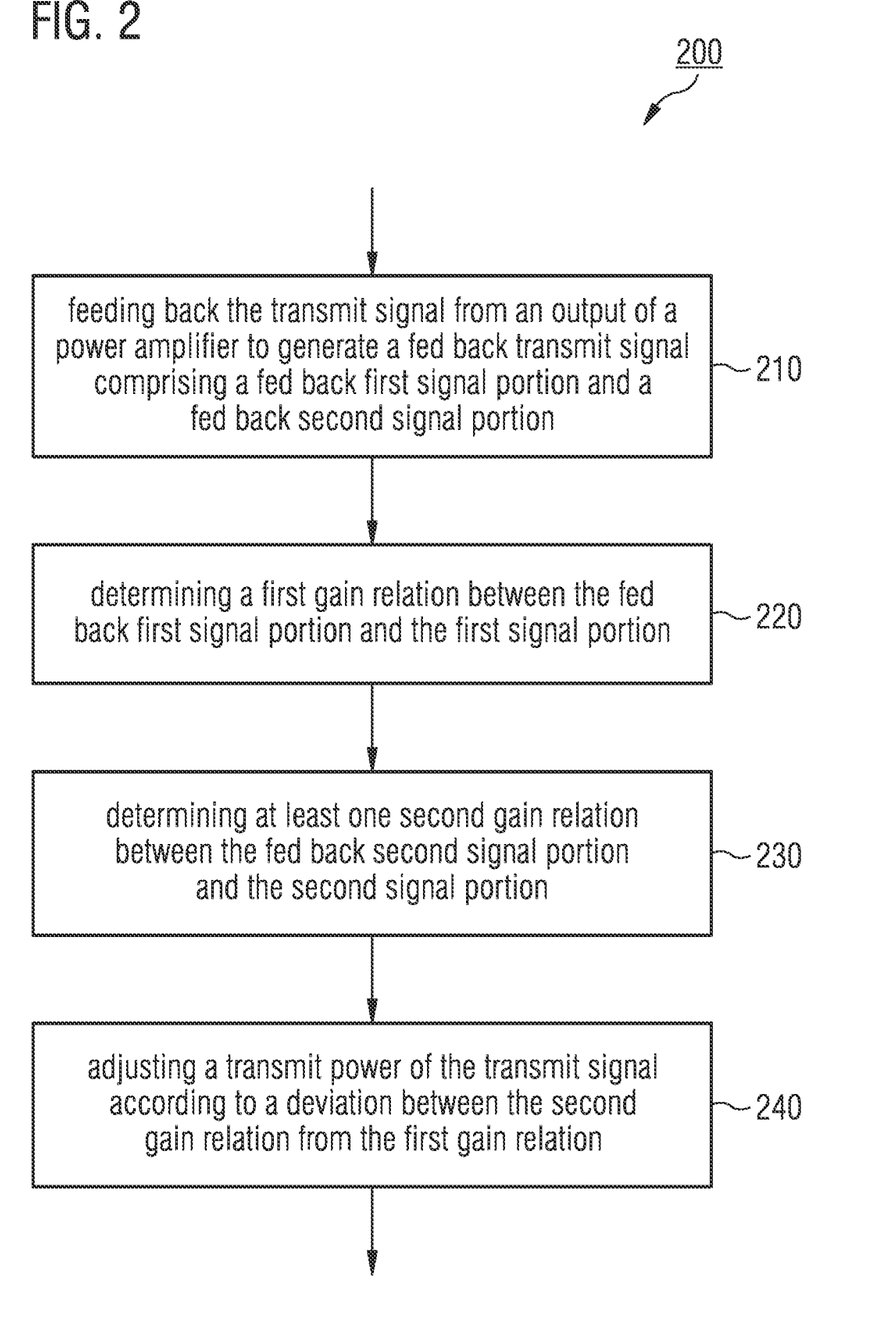
FIG. 2 shows a flowchart of a method for transmitting a transmit signal comprising a first signal portion and a second signal portion according to an example of the present disclosure.

The skilled person having benefit from the present disclosure will appreciate that transmitter 100 can be used to carry out a method in accordance with the present disclosure. An example of such a method 200 for transmitting a transmit signal 112 comprising a first signal portion 112-1 and a second signal portion 112-2 is shown in FIG. 2.

Method 200 includes feeding back 210 the transmit signal 112 from an output of a power amplifier 120 to generate a fed back transmit signal 132 comprising a fed back first signal portion 132-1 and a fed back second signal portion 132-2. Method further includes determining 220 a first gain relation $G_1$ between the fed back first signal portion 132-1 and the first signal portion 112-1 and determining 230 at least one second gain relation $G_2$ between the fed back second signal portion 132-2 and the second signal portion 112-2. A transmit power of the transmit signal 112 is adjusted 240 according to a deviation $\Delta G$ between the second gain relation $G_2$ from the first gain relation $G_1$.

Thus, examples of the proposed concept propose a loopback from PA output to a Digital-Signal-Processor (DSP) at the transmitter side of a communication link, such that the PA output samples can be captured and analyzed. Based thereon the digital TX samples can be compensated to achieve an essentially non-varying gain in the RF domain between the different signal portions. Assuming that the loopback and the receive path are less sensitive to PA heating and other TX RF phenomena, the differential change in gain as observed at loopback output is assumed to reflect the TX portion only, and accordingly a TX Digital Front-End (DFE) can perform the desired correction.

Figure 3:
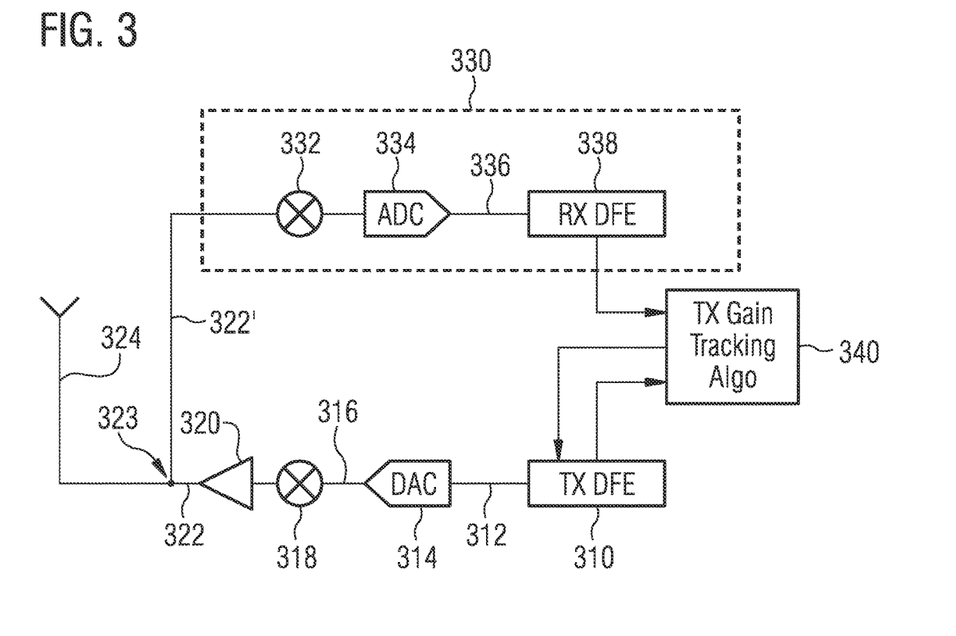
FIG. 3 shows a block diagram of a transmitter including a feedback receiver according to the present disclosure according to an example of the present disclosure.

Turning now to FIG. 3, it is shown a more detailed block diagram of a transmitter 300 according to an example of the present disclosure.

Figure 4:
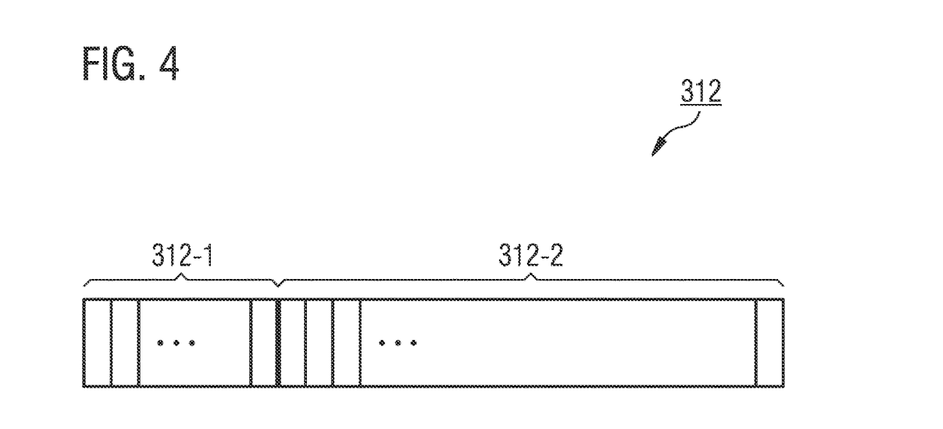
FIG. 4 shows a structure of a data packet with a preamble portion and a payload portion.

Transmitter 300 comprises TX DFE circuitry 310 configured to generate a digital transmit signal 312 comprising a preamble signal portion 312-1 and a payload signal portion 312-2. A schematic view of a data packet of digital transmit signal 312 is shown in FIG. 4. Preamble signal portion 312-1 comprises a plurality of preamble or header symbols. One or more preamble symbols can be predefined training or pilot symbols, which can be used for channel estimation at a receiving end of a wired or wireless communication channel. The 802.11 standards also refer to such training symbols as Short Training Field (STF) or Long Training Field (LTF). Payload signal portion 312-2 comprises a plurality of payload symbols carrying non-predetermined useful information. Data symbols of digital transmit signal 312 may be modulated according to a digital modulation scheme. Examples of digital modulation schemes are Amplitude Shift Keying (ASK), Phase Shift Keying (PSK), Quadrature Amplitude Modulation (QAM), and the like. In some examples, a size M symbol alphabet of the constellation diagram can be of higher order, such as, for example, $M \geq 64$, $M \geq 256$, or $M \geq 1024$. The proposed concept may be particularly useful for such higher order modulation schemes.

In some examples, the digital transmit signal 312 can be an OFDM signal. The skilled person having benefit from the present disclosure will appreciate that transmitter 300 would then also include corresponding processing circuitry, such as an Inverse Fast Fourier Transform (IFFT) processing block, for example. Of course the proposed concept can by applied to various types of transmit signals according to various modulation and/or multiplexing schemes.

An output of TX DFE circuitry 310 is coupled to an input of DAC 314, which is configured to convert the digital baseband transmit signal 312 to the analog signal domain to obtain an analog baseband transmit signal 316. Analog baseband transmit signal 316 is converted to RF domain using a mixer 318, which mixes the analog baseband transmit signal 316 with a sinusoidal carrier signal at an RF carrier or center frequency. Depending on the underlying technology, the RF carrier frequency can be in the MHz or GHz region. For 802.11 types of Wireless Local Area Networks (WLANs) the carrier frequency can be 2.4 GHz or 5 GHz. 802.11 ax, for example, is a type of WLAN in the IEEE 802.11 set of types of WLANs. It is designed to improve overall spectral efficiency and is predicted to have a top speed of around 10 Gbit/s.

The analog RF transmit signal at the output of mixer 318 is fed to PA 320 which is configured to amplify the analog RF transmit signal. The skilled person having benefit from the present disclosure will appreciate that the PA 320 is prone to undesired gain variations throughout the transmission of a data packet, for example due to the PA's temperature variations and other physical phenomena. Amplified RF TX signal 322 is fed to TX antenna 324. The transmit path is also coupled to a feedback path, for example, via a directional coupler 323 which is configured to couple a defined amount of the electromagnetic TX power in the TX path to a port enabling the RF TX signal to be fed back to TX FBR 330. An optional attenuator (not shown) can be used to decrease the power of the fed back RF TX signal to a working range of a Low Noise Amplifier (LNA) of TX FBR 330 which is coupled to the output of PA 320 and configured to receive a fed back version 322' of the RF TX signal from PA 320.

TX FBR 330 can comprise at least one mixer 332 to down-convert the fed back RF TX signal 322' from RF to baseband domain. The resulting analog baseband signal can be analog-to-digital converted via ADC 334 to obtain a fed back digital transmit signal 336 comprising a fed back preamble signal portion 336-1 and a fed back payload signal portion 336-2. The fed back digital transmit signal 336 can be fed to digital RX DFE circuitry 338 to determine a RX signal power of the fed back preamble signal portion 336-1 and the fed back payload signal portion 336-2, respectively. Based on the RX signal power of the fed back preamble signal portion 336-1 and the fed back payload signal portion 336-2 and based on the TX signal power of the preamble signal portion 312-1 and the payload signal portion 312-2, TX Gain tracking circuitry 340 can be configured to determine a preamble signal power relation $G_1$ between the fed back preamble signal portion 336-1 and the preamble signal portion 312-1 and to determine at least one payload signal power relation $G_2$ between the fed back payload signal portion 336-2 and the payload signal portion 312-2. A power of a payload signal portion 312-2 of the digital transmit signal 312 can be adjusted according to a variation/deviation $\Delta G$ between the preamble signal power relation and the payload signal power relation.

As has been described before, the preamble signal portion 312-1 of the digital transmit signal 312 can comprise at least one digital training symbol. The payload signal portion 312-2 of the digital transmit signal 312 can comprise a plurality of digital payload symbols. TX Gain tracking circuitry 340 can comprise digital baseband circuitry which is configured to determine the preamble signal power relation $G_1$ by relating a symbol power of one or more digital training symbols to a symbol power of one or more fed back digital training symbols, and to determine the payload signal power relation $G_2$ by relating a symbol power of one or more digital payload symbols to a symbol power of one or more corresponding fed back digital payload symbols. The relation between the symbol power of one or more digital training or preamble symbols and the symbol power of one or more corresponding fed back digital training or preamble symbols can be referred to as relative preamble gain. Likewise, the relation between the symbol power of one or more digital payload symbols and the symbol power of one or more corresponding fed back digital payload symbols can be referred to as relative payload gain. Assuming that the loopback and the RX path are less sensitive to PA heating and other TX RF phenomena, then the differential change in relative gain as observed at loopback output can be assumed to reflect gain variations of the TX portion only, and accordingly TX Gain tracking circuitry 340 can perform the desired corrections to the digital transmit signal 312.

Figure 5:
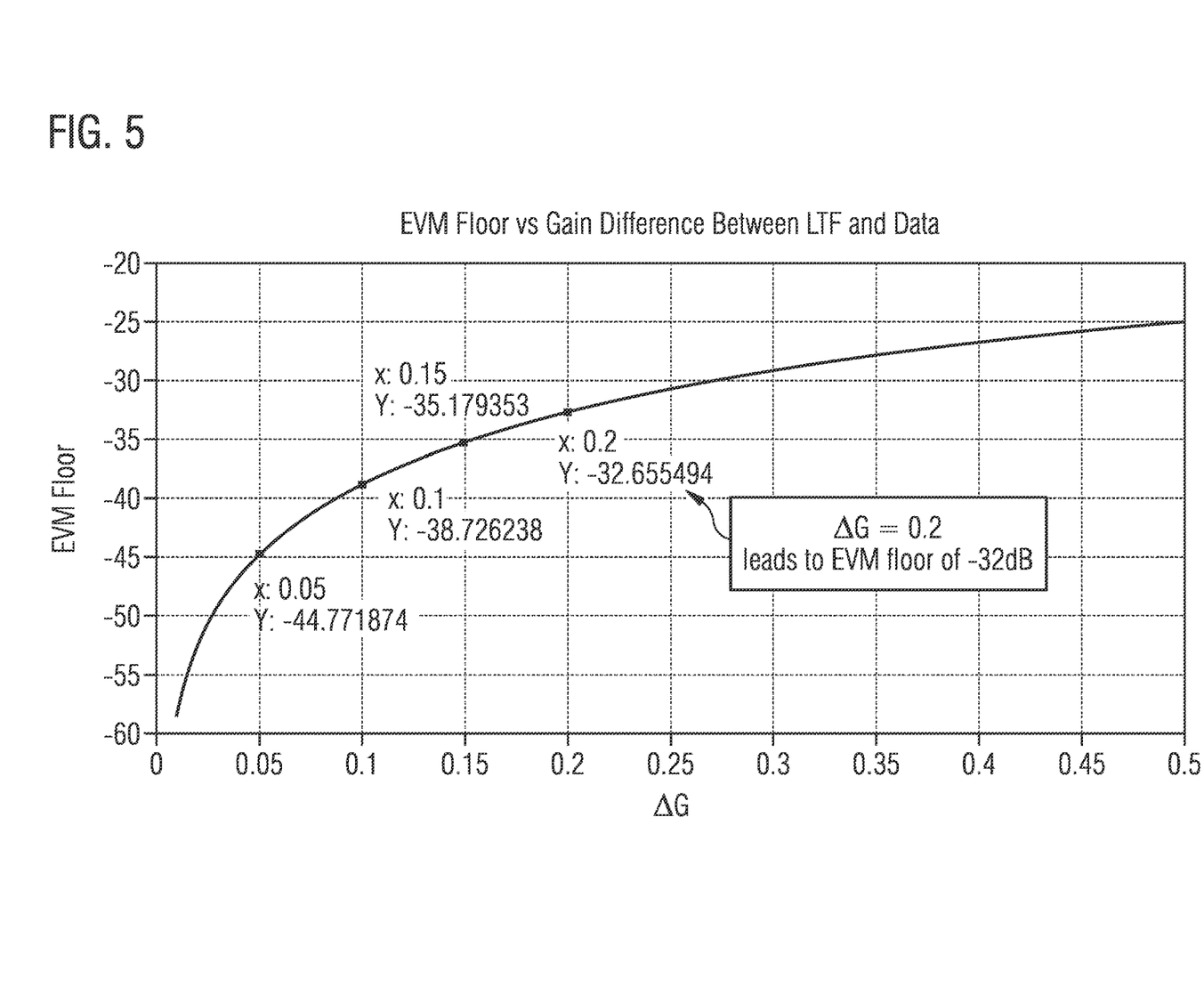
FIG. 5 illustrates and EVM floor as a function of gain variation.

In communications standards that employ a preamble for the sake of channel estimation, the relative preamble and payload gains $G_1$, $G_2$ should be kept essentially constant and/or equal over the duration of a packet. Thus, examples of the present disclosure propose leveling out relative preamble and payload gains by adjusting the power or amplitude of digital transmit signal 312. If one or more payload symbols have experienced more PA gain than one or more preamble symbols, the instantaneous power or amplitude of digital payload symbols can be decreased accordingly. Likewise, if one or more payload symbol have experienced less PA gain than one or more preamble symbols, the instantaneous power or amplitude of digital payload symbols can be increased accordingly. In other words, the instantaneous transmit power of the payload portion can be increased if a comparison of the relative preamble and payload gains is indicative of a smaller power amplification of the fed back payload signal portion 336-2 compared to the fed back preamble signal portion 336-1. On the other hand, the instantaneous transmit power of the payload portion can be reduced if the comparison is indicative of a larger power amplification of the fed back payload signal portion compared to the fed back preamble signal portion In some examples, the TX FBR 330 can normalize the constellation power (of an employed constellation diagram) according to the received preamble 336-1. Any deviation $\Delta G$ of the payload portion 336-2 from that normalization can cause EVM floor and can limit the link quality. The EVM floor caused by $\Delta G$ satisfies $$20\log_{10}\left(10^{\frac{\Delta G}{20}} - 1\right)$$

and is depicted in FIG. 5. A deviation of $\Delta G=0.2$ between preamble and payload portion can cause an EVM floor of −32 dB, which may be prohibitive for certain applications. A deviation of $\Delta G=0.1$ between preamble and payload portion can cause an EVM floor of −38 dB, which may still be prohibitive for certain applications.

According to examples of the present disclosure, a relative reference gain between TX and RX (or TX FBR) can be measured using baseband samples of preamble portions 312-1 and 336-1. This relative reference gain can be denoted as $G_1$. Then the relative payload gain between TX and RX can be tracked for each payload symbol in the packet. This relative payload gain can be denoted as $G_2$. TX Gain tracking circuitry 340 can be configured to calculate $\Delta G$ based on different possible metrics, such as, for example, $\Delta G=G_2-G_1$ or $\Delta G=G_2/G_1$, and to change the digital gain in TX DFE 310 with the opposite sign or factor such that the overall gain (digital+RF) will be essentially constant throughout the packet. In other words, undesired gain variations of PA 320 can be compensated by opposite gain variations of the digital transmit signal 312. In other words, an amplitude of a current or instantaneous constellation symbol to be transmitted is adjusted.

Figure 6:
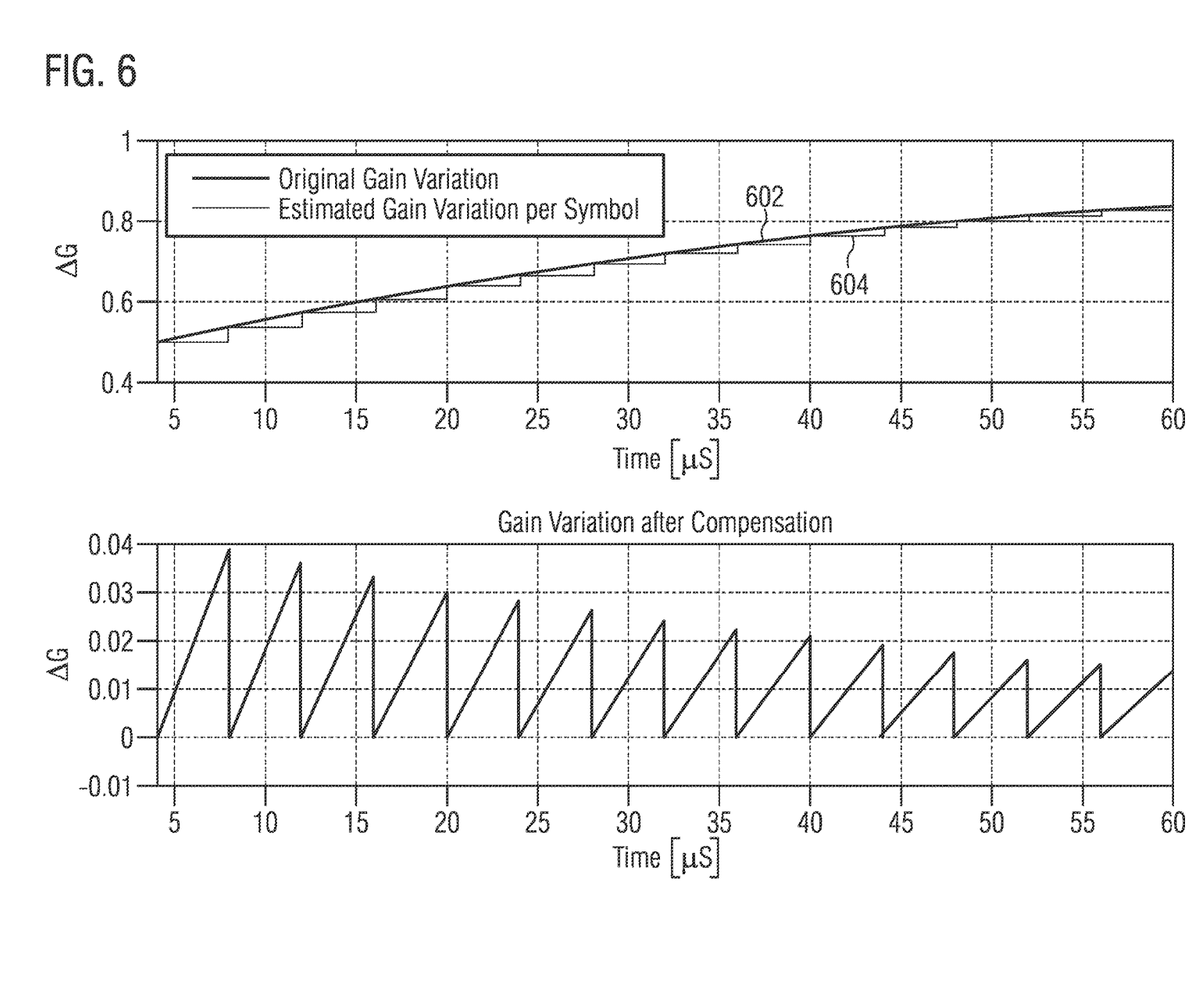
FIG. 6 shows an illustration of a gain variation with pre-symbol compensation according to an example of the present disclosure.

One example of digital gain compensation is schematically illustrated in FIG. 6.

Curve 602 denotes an original (uncompensated) gain variation of payload symbols with respect to $G_1$ (relative preamble gain). As can be seen, the uncompensated gain variation rises from 0.5 up to over 0.8 in the illustrated example, which would lead to an unacceptably high EVM floor for certain applications. Curve 604 illustrates a course of $\Delta G$ with symbol-by-symbol gain tracking. The instantaneous digital gain of symbol n is adjusted based on the measured $\Delta G[n-1]$, which can be computed as $\Delta G[n-1]=G_2[n-1]-G_1$ or $\Delta G[n-1]=G_2[n-1]/G_1$, or $\Delta G[n-1]=G_1/G_2[n-1]$ according to various embodiments. Depending on the used measure, the adjustment can be done with the opposite sign or factor of $\Delta G[n-1]$. The lower portion of FIG. 6 illustrates the resulting gain variation $\Delta G$ with pre-symbol compensation. It can be see that the maximum deviation is $\Delta G=0.04$, leading to an EVM of less than −45 dB according to FIG. 5. This EVM is acceptable for most applications.

Although FIG. 6 suggests updating the compensation factor every payload symbol, the skilled person having benefit from the present disclosure will appreciate that the compensation factor could also be updated less frequently. It could also be updated only every m payload symbols ($m \geq 2$). The update rate can depend on the strength of the PA's gain variation.

The gain deviation during the data packet is caused by a physical phenomenon which is deterministic but depends on a lot of parameters (such as environment temperature, TX duty cycle, TX power, etc. . . . ). Thus, when a TX device is in a steady mode, the gain profile during subsequent packets may be the same and/or constant. In such cases, a parametric approach can be used alternatively or additionally. The parametric approach can use the same algorithm for few packets and fit a parametric model to the measured gain profile. If the model fits the measurement, the parametric model can be used without sniffing the signal with RX. The parametric approach can reduce power consumption because less hardware blocks have to be turned on. When the system is in parametric mode, gain profile measurements can be triggered periodically to improve the parameters and exit the parametric mode if the model no longer fits the current physical state. Thus, in some embodiments processing circuitry 340 can be configured to adjust parameters of a parametric gain model based on the determined reference gain value $G_1$ and/or the payload signal gain value $G_2$. Power adjustment circuitry can be configured to adjust the transmit power of the current payload signal portion based on the parametric gain model.

Figure 7:
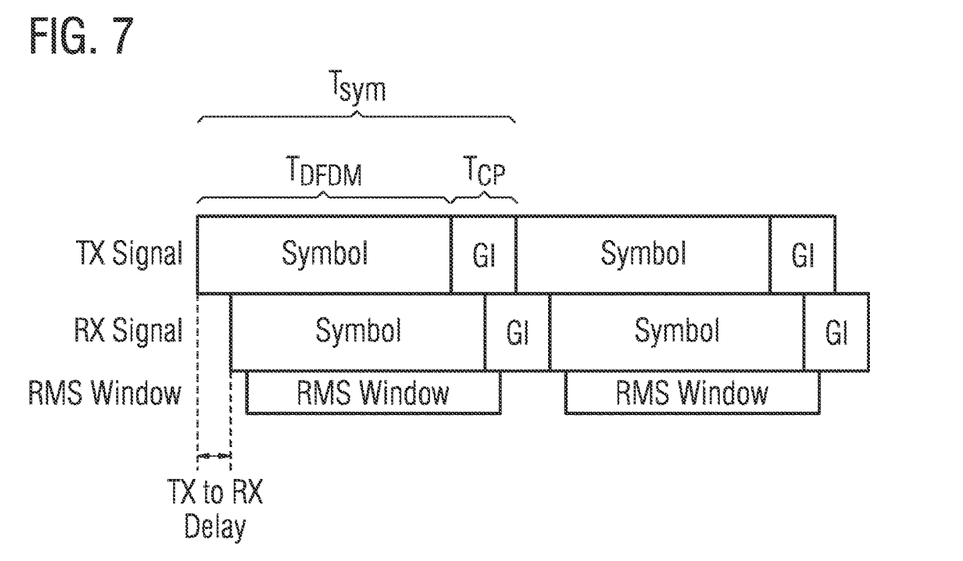
FIG. 7 demonstrates an averaged power over symbols concept according to an example of the present disclosure.

The skilled person having benefit from the present disclosure will appreciate that the fed back RX signal 336 may be somewhat delayed compared to TX signal 312 due to digital and RF delays inside the transmitter hardware (e.g., a transmitter or transceiver chip). This scenario is schematically illustrated in FIG. 7.

In order to avoid complex synchronization algorithms or delay calibration for comparing sample by sample correctly, some examples propose comparing an averaged power over corresponding symbols. For OFDM symbols, for example, each OFDM symbol comprises a data portion of length $T_{OFDM}=1/\Delta f_{OFDM}$ and a Guard Interval (GI) or cyclic prefix of length $T_{CP}$, such that the total symbol length is $T_{sym}=T_{OFDM}+T_{CP}$. Due to the cyclic prefix the averaged power of any window of length $T_{OFDM}$ within the symbol equals the real power. By designing the system such that the delay between TX and RX is no longer than $T_{CP}$, a constant delay can be used over all scenarios. The power measured from RX signal 336 and TX signal 312 can be compared relatively in order to avoid compensation the effect of the constellation on the symbol's power.

The following example illustrates a computation of $\Delta G[n]$ for the n-th payload symbol, given $N_{sym}$ samples at sampling rate SR per symbol duration $T_{sym}$.

$$N_{Sym} = SR * T_{Sym}$$

$$N_{RX} = N_{TX} + N_{RXTXDelay}$$

$$G_1 = \frac{\sum_{i=N_{RX}}^{N_{RX}+N_{Sym}} LTF_n^{RX}[i]}{\sum_{i=N_{TX}}^{N_{TX}+N_{Sym}} LTF_n^{TX}[i]}$$

$$G_2[n] = \frac{\sum_{i=N_{RX}}^{N_{RX}+N_{Sym}} S_n^{RX}[i]}{\sum_{i=N_{TX}}^{N_{TX}+N_{Sym}} S_n^{TX}[i]}$$

$$\Delta G[n] = \frac{G_2[n]}{G_1}$$

wherein $LTF^{RX}$ is the signal received in the RX (loopback) when the first Long Training Field (LTF) received is on air, $LTF^{TX}$ is the signal recorded from TX when the first LTF received is on air, $S_n^{RX}$ is the signal received in the RX (loopback) when the nth symbol after the first LTF is on air, $S_n^{RX}$ is the signal recorded from TX when the nth symbol after the first LTF is on air, $N_{RXTXDelay}$ is the samples delay between TX and RX, SR is the clock rate the block is working in (and also the TX and RX DFEs), and $T_{sym}$ is symbol length. In 802.11n\11ac it is 3.2 μs and in 802.11ax it is 12.8 μs.

The present disclosure proposes a loopback from PA output to the DSP (at the transmitter side of the link), such that the PA output samples can be captured and analyzed, and consequentially the TX digital samples can be compensated to achieve a non-varying gain in the RF domain. Thus, the compensation of undesirably varying PA gain can be done in the digital baseband domains of TX and TX FBR path. Some examples propose calculating the Root Mean Square (RMS) of each symbol at the TX and RX and computing the relative gain. Thus, the hardware can be kept very small and simple to apply.

Figure 8:
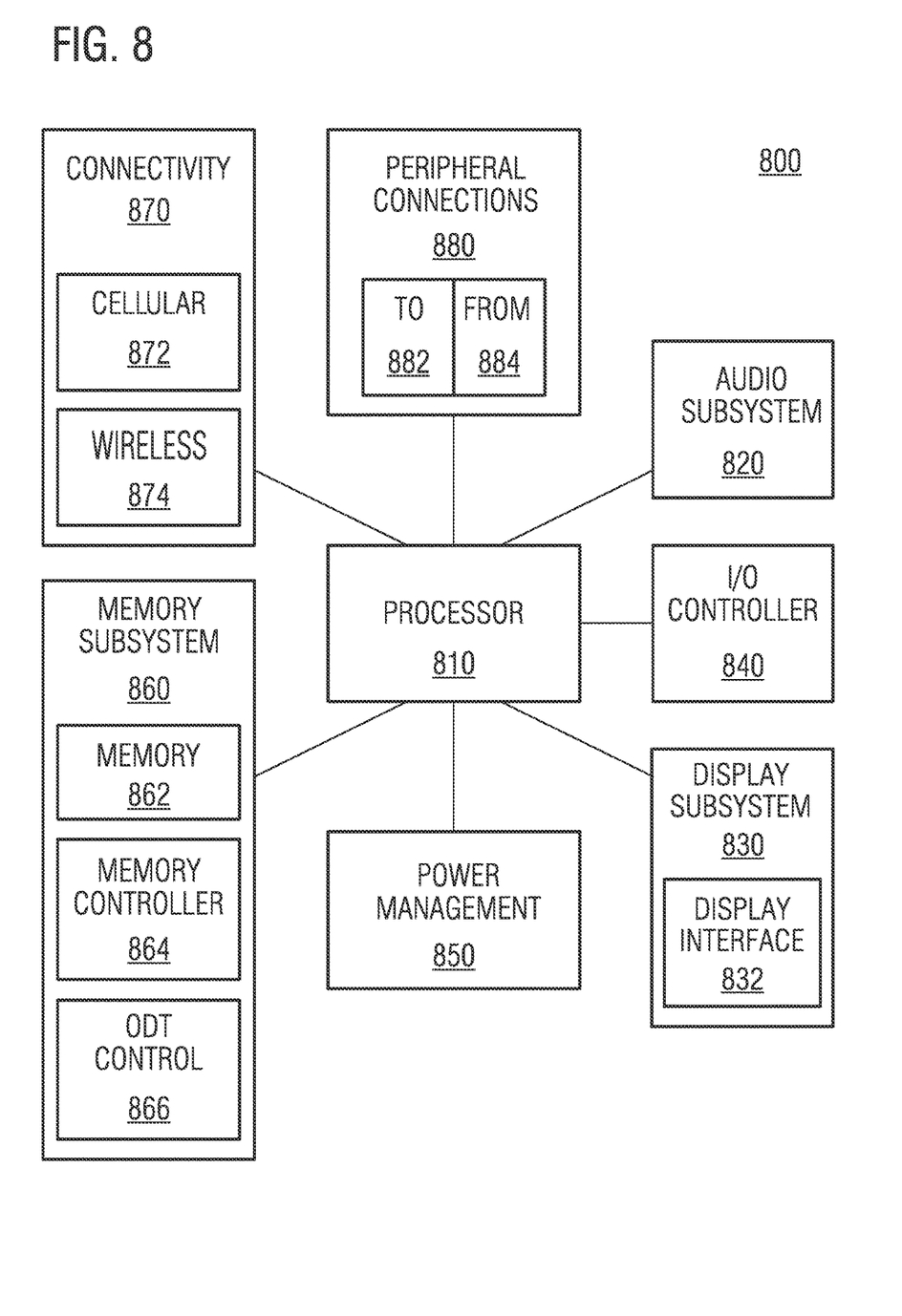
FIG. 8 a schematic block diagram of a mobile device.

FIG. 8 is a more detailed block diagram of an example of a device, e.g. a mobile or an access point device, in which the proposed concept of the present disclosure can be implemented. Device 800 represents a mobile computing device, such as a computing tablet, a mobile phone or smartphone, a wireless-enabled e-reader, wearable computing device, or other mobile device. It will be understood that certain of the components are shown generally, and not all components of such a device are shown in device 800.

Device 800 includes processor 810, which performs the primary processing operations of device 800. Processor 810 can include one or more physical devices, such as microprocessors, application processors, microcontrollers, programmable logic devices, or other processing means. The processing operations performed by processor 810 include the execution of an operating platform or operating system on which applications and/or device functions are executed. The processing operations include operations related to I/O (input/output) with a human user or with other devices, operations related to power management, and/or operations related to connecting device 800 to another device. The processing operations can also include operations related to audio I/O and/or display I/O.

In one embodiment, device 800 includes audio subsystem 820, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into device 800, or connected to device 800. In one embodiment, a user interacts with device 800 by providing audio commands that are received and processed by processor 810.

Display subsystem 830 represents hardware (e.g., display devices) and software (e.g., drivers) components that provide a visual and/or tactile display for a user to interact with the computing device. Display subsystem 830 includes display interface 832, which includes the particular screen or hardware device used to provide a display to a user. In one embodiment, display interface 832 includes logic separate from processor 810 to perform at least some processing related to the display. In one embodiment, display subsystem 830 includes a touchscreen device that provides both output and input to a user. In one embodiment, display subsystem 830 includes a high definition (HD) display that provides an output to a user. High definition can refer to a display having a pixel density of approximately 100 PPI (pixels per inch) or greater, and can include formats such as full HD (e.g., 1080p), retina displays, 4K (ultra high definition or UHD), or others.

I/O controller 840 represents hardware devices and software components related to interaction with a user. I/O controller 840 can operate to manage hardware that is part of audio subsystem 820 and/or display subsystem 830. Additionally, I/O controller 840 illustrates a connection point for additional devices that connect to device 800 through which a user might interact with the system. For example, devices that can be attached to device 800 might include microphone devices, speaker or stereo systems, video systems or other display device, keyboard or keypad devices, or other I/O devices for use with specific applications such as card readers or other devices.

As mentioned above, I/O controller 840 can interact with audio subsystem 820 and/or display subsystem 830. For example, input through a microphone or other audio device can provide input or commands for one or more applications or functions of device 800. Additionally, audio output can be provided instead of or in addition to display output. In another example, if display subsystem includes a touchscreen, the display device also acts as an input device, which can be at least partially managed by I/O controller 840. There can also be additional buttons or switches on device 800 to provide I/O functions managed by I/O controller 840.

In one embodiment, I/O controller 840 manages devices such as accelerometers, cameras, light sensors or other environmental sensors, gyroscopes, global positioning system (GPS), or other hardware that can be included in device 800. The input can be part of direct user interaction, as well as providing environmental input to the system to influence its operations (such as filtering for noise, adjusting displays for brightness detection, applying a flash for a camera, or other features). In one embodiment, device 800 includes power management 850 that manages battery power usage, charging of the battery, and features related to power saving operation.

Memory subsystem 860 includes memory device(s) 862 for storing information in device 800. Memory subsystem 860 can include nonvolatile (state does not change if power to the memory device is interrupted) and/or volatile (state is indeterminate if power to the memory device is interrupted) memory devices. Memory 860 can store application data, user data, music, photos, documents, or other data, as well as system data (whether long-term or temporary) related to the execution of the applications and functions of system 800. In one embodiment, memory subsystem 860 includes memory controller 864 (which could also be considered part of the control of system 800, and could potentially be considered part of processor 810). Memory controller 864 includes a scheduler to generate and issue commands to memory device 862.

Connectivity 870 includes hardware devices (e.g., wireless and/or wired connectors and communication hardware) and software components (e.g., drivers, protocol stacks) to enable device 800 to communicate with external devices. The external device could be separate devices, such as other computing devices, wireless access points or base stations, as well as peripherals such as headsets, printers, or other devices.

Connectivity 870 can include multiple different types of connectivity. To generalize, device 800 is illustrated with cellular connectivity 872 and wireless connectivity 874. Cellular connectivity 872 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), or other cellular service standards. Wireless connectivity 874 refers to wireless connectivity that is not cellular, and can include personal area networks (such as Bluetooth), local area networks (such as Wi-Fi), and/or wide area networks (such as WiMAX), or other wireless communication, such as NFC. Wireless communication refers to transfer of data through the use of modulated electromagnetic radiation through a non-solid medium. Wired communication occurs through a solid communication medium. Cellular connectivity 872 and/or wireless connectivity 874 can implement example transceivers of the present disclosure for TX signal gain compensation.

Peripheral connections 880 include hardware interfaces and connectors, as well as software components (e.g., drivers, protocol stacks) to make peripheral connections. It will be understood that device 800 could both be a peripheral device ("to" 882) to other computing devices, as well as have peripheral devices ("from" 884) connected to it. Device 800 commonly has a "docking" connector to connect to other computing devices for purposes such as managing (e.g., downloading and/or uploading, changing, synchronizing) content on device 800. Additionally, a docking connector can allow device 800 to connect to certain peripherals that allow device 800 to control content output, for example, to audiovisual or other systems.

In addition to a proprietary docking connector or other proprietary connection hardware, device 800 can make peripheral connections 880 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

The following examples pertain to further embodiments.

Example 1 is a method for transmitting a transmit signal comprising a first signal portion and a second signal portion. The method includes feeding back the transmit signal from an output of a power amplifier to generate a fed back transmit signal comprising a fed back first signal portion and a fed back second signal portion, determining a first gain relation between the fed back first signal portion and the first signal portion, determining at least one second gain relation between the fed back second signal portion and the second signal portion, and adjusting a transmit power of the transmit signal according to a deviation between the second gain relation from the first gain relation.

In Example 2, the method of Example 1 can optionally further include digital-to-analog converting a digital transmit signal to generate an analog transmit signal, power amplifying the analog transmit signal with the power amplifier to generate power amplified transmit signal, feeding back the power amplified transmit signal from the output of the power amplifier to a transmit feedback receiver to generate the fed back transmit signal, and analog-to-digital converting the fed back transmit signal to generate fed back digital transmit signal.

In Example 3, determining the first and the second gain relation can optionally be based on using digital baseband samples of the digital transmit signal and the fed back digital transmit signal of Example 2.

In Example 4, the first signal portion of the transmit signal of any of one of the previous Examples comprises at least one training symbol and the second signal portion of the transmit signal comprises a plurality of payload symbols. Determining the first gain relation can optionally comprise relating a symbol power of the training symbol to a symbol power of the corresponding fed back training symbol, or vice versa, and determining the second gain relation can optionally comprise relating a symbol power of a payload symbol to a symbol power of a corresponding fed back payload symbol, or vice versa.

In Example 5, the respective symbol powers of Example 4 can be determined by averaging corresponding digital baseband samples over a symbol duration.

In Example 6, adjusting the transmit power of any one of the previous Example can optionally comprise increasing the transmit power if a comparison of the first and the second gain relation is indicative of a smaller power amplification of the fed back second signal portion compared to the fed back first signal portion, or reducing the transmit power if the comparison is indicative of a larger power amplification of the fed back second signal portion compared to the fed back first signal portion.

In Example 7, the method of any one of the previous Examples can optionally further include adjusting parameters of a parametric gain model based on the first and second gain relations, and applying the parametric gain model to adjust the transmit power of the transmit signal.

In Example 8, the first signal portion of any one of the previous Examples can be part of a preamble of a transmit data packet and the second signal portion of any one of the previous Examples can be part of a payload the transmit data packet.

In Example 9, the method of any one of the previous Examples can optionally further include modulating the transmit signal according to a modulation scheme with a symbol alphabet having M≥64 symbols.

In Example 10, the transmit signal of any one of the previous Examples can be an OFDM signal.

Example 11 is a computer program product comprising a non-transitory computer readable medium having computer readable program code embodied therein, wherein the computer readable program code, when being loaded on a computer, a processor, or a programmable hardware component, is configured to implement a method for transmitting a transmit signal comprising a first signal portion and a second signal portion. The method includes feeding back the transmit signal from an output of a power amplifier to generate a fed back transmit signal comprising a fed back first signal portion and a fed back second signal portion, determining a first gain relation between the fed back first signal portion and the first signal portion, determining at least one second gain relation between the fed back second signal portion and the second signal portion, and adjusting a transmit power of the transmit signal according to a deviation between the second gain relation from the first gain relation.

Example 12 is a transmitter for transmitting a transmit signal comprising a first signal portion and a second signal portion. The transmitter comprises a power amplifier configured to amplify the transmit signal, a transmit feedback receiver coupled to an output of the power amplifier and configured to feed back the transmit signal to generate a fed back first signal portion and a fed back second signal portion, processing circuitry configured to determine a first gain relation between the fed back first signal portion and the first signal portion and to determine at least one second gain relation between the fed back second signal portion and the second signal portion, and power adjustment circuitry configured to adjust a transmit power of the transmit signal according to a variation between the first gain relation and the second gain relation.

In Example 13, the transmitter of Example 12 can further optionally comprise a digital-to-analog converter configured to digital-to-analog convert a digital transmit signal to an analog transmit signal, wherein the power amplifier can be configured to amplify the analog transmit signal to generate power amplified transmit signal, and wherein the transmit feedback receiver can comprise an analog-to-digital converter configured to analog-to-digital convert the transmit signal fed back from the power amplifier to a fed back digital transmit signal.

In Example 14, the processing circuitry of any one of Examples 12 or 13 can optionally comprise digital baseband circuitry configured to determine the first and the second gain relation based on digital baseband samples of the digital transmit signal and the fed back digital transmit signal.

In Example 15, the first signal portion of the transmit signal of any one of Examples 12 to 14 can comprise at least one training symbol and the second signal portion of the transmit signal of any one of Examples 12 to 14 can comprise a plurality of payload symbols. The processing circuitry can comprise digital baseband circuitry and can be configured to determine the first gain relation by relating a symbol power of a training symbol to a symbol power of a fed back training symbol, and to determine the second gain relation by relating a symbol power of a payload symbol to a symbol power of a corresponding fed back payload symbol.

In Example 16, the digital baseband circuitry of Example 15 can be configured to determine the respective symbol powers by averaging corresponding digital baseband samples over a symbol duration.

In Example 17, the transmitter of any one of Examples 12 to 16 can optionally further comprise a modulator configured to modulate the transmit signal according to a modulation scheme with a symbol alphabet having M≥64 symbols.

In Example 18, a transmit symbol of the transmit signal of any one of Examples 12 to 17 can comprise a cyclic prefix and the transmitter of any one of Examples 12 to 17 can be configured for a signal propagation delay of the transmit signal to the transmit feedback receiver smaller than a duration of the cyclic prefix.

In Example 19, the processing circuitry of any one of Examples 12 to 18 can further optionally be configured to adjust parameters of a parametric gain model based on the determined first gain relation and the second gain relation, and wherein the power adjustment circuitry is configured to adjust the transmit power of the current payload signal portion based on the parametric gain model.

Example 20 is a transmitter for a wireless communication systems. The transmitter comprises transmitter front end circuitry configured to generate a digital transmit signal comprising a preamble signal portion and a payload signal portion, a digital-to-analog converter configured to convert the digital transmit signal to an analog transmit signal, a power amplifier configured to amplify the analog transmit signal, wherein the power amplifier is prone to undesired gain variations, a transmit feedback receiver coupled to an output of the power amplifier and configured to receive a fed back version of the transmit signal from the power amplifier, wherein the transmit feedback receiver comprises an analog-to-digital converter configured to analog-to-digital convert the fed back version of the transmit signal to a fed back digital transmit signal comprising a fed back preamble signal portion and a fed back payload signal portion, processing circuitry configured to determine a preamble signal power relation between the fed back preamble signal portion and the preamble signal portion and to determine at least one payload signal power relation between the fed back payload signal portion and the payload signal portion, and power adjustment circuitry configured to adjust a power of a payload signal portion of the digital transmit signal according to a variation between the preamble signal power relation and the payload signal power relation.

In Example 21, the preamble signal portion of the digital transmit signal of Example 20 can comprise at least one digital training symbol and the payload signal portion of the digital transmit signal of Example 20 can comprise a plurality of digital payload symbols. The processing circuitry can comprise digital baseband circuitry configured to determine the preamble signal power relation by relating a symbol power of a digital training symbol to a symbol power of a fed back digital training symbol, and to determine the payload signal power relation by relating a symbol power of a digital payload symbol to a symbol power of a corresponding fed back digital payload symbol.

In Example 22, the transmitter of any one of Examples 20 or 21 can optionally further comprise a digital modulator configured to modulate the digital transmit signal according to a digital modulation scheme with a symbol alphabet having M≥64 symbols.

In Example 23, the transmitter of any one of Examples 20 to 22 can be configured to transmit the transmit signal as an OFDM signal.

The skilled person having benefit from the present disclosure will appreciate that the various examples described herein can be implemented individually or in combination.

The aspects and features mentioned and described together with one or more of the previously detailed examples and figures, may as well be combined with one or more of the other examples in order to replace a like feature of the other example or in order to additionally introduce the feature to the other example.

Examples may further be a computer program having a program code for performing one or more of the above methods, when the computer program is executed on a computer or processor. Steps, operations or processes of various above-described methods may be performed by programmed computers or processors. Examples may also cover program storage devices such as digital data storage media, which are machine, processor or computer readable and encode machine-executable, processor-executable or computer-executable programs of instructions. The instructions perform or cause performing some or all of the acts of the above-described methods. The program storage devices may comprise or be, for instance, digital memories, magnetic storage media such as magnetic disks and magnetic tapes, hard drives, or optically readable digital data storage media. Further examples may also cover computers, processors or control units programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and examples of the disclosure, as well as specific examples thereof, are intended to encompass equivalents thereof.

A functional block denoted as "means for . . . " performing a certain function may refer to a circuit that is configured to perform a certain function. Hence, a "means for s.th." may be implemented as a "means configured to or suited for s.th.", such as a device or a circuit configured to or suited for the respective task.

Functions of various elements shown in the figures, including any functional blocks labeled as "means", "means for providing a sensor signal", "means for generating a transmit signal.", etc., may be implemented in the form of dedicated hardware, such as "a signal provider", "a signal processing unit", "a processor", "a controller", etc. as well as hardware capable of executing software in association with appropriate software. When provided by a processor, the functions may be provided by a single dedicated processor, by a single shared processor, or by a plurality of individual processors, some of which or all of which may be shared. However, the term "processor" or "controller" is by far not limited to hardware exclusively capable of executing software, but may include digital signal processor (DSP) hardware, network processor, application specific integrated circuit (ASIC), field programmable gate array (FPGA), read only memory (ROM) for storing software, random access memory (RAM), and nonvolatile storage. Other hardware, conventional and/or custom, may also be included.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. A method for transmitting a transmit signal comprising a first signal portion and a second signal portion, the method comprising:
    feeding back the transmit signal from an output of a power amplifier to generate a fed back transmit signal comprising a fed back first signal portion and a fed back second signal portion;
    determining a first gain relation between the fed back first signal portion and the first signal portion;
    determining at least one second gain relation between the fed back second signal portion and the second signal portion; and
    adjusting a transmit power of the transmit signal according to a deviation between the second gain relation from the first gain relation.

2. The method of claim 1, further comprising:
    digital-to-analog converting a digital transmit signal to generate an analog transmit signal;
    power amplifying the analog transmit signal with the power amplifier to generate power amplified transmit signal;
    feeding back the power amplified transmit signal from the output of the power amplifier to a transmit feedback receiver to generate the fed back transmit signal; and
    analog-to-digital converting the fed back transmit signal to generate fed back digital transmit signal.

3. The method of claim 2, wherein determining the first and the second gain relation is based on using digital baseband samples of the digital transmit signal and the fed back digital transmit signal.

4. The method of claim 1, wherein the first signal portion of the transmit signal comprises at least one training symbol and the second signal portion of the transmit signal comprises a plurality of payload symbols, wherein determining the first gain relation comprises relating a symbol power of the training symbol to a symbol power of the corresponding fed back training symbol, or vice versa, and wherein determining the second gain relation comprises relating a symbol power of a payload symbol to a symbol power of a corresponding fed back payload symbol, or vice versa.

5. The method of claim 4, wherein the respective symbol powers are determined by averaging corresponding digital baseband samples over a symbol duration.

6. The method of claim 1, wherein adjusting the transmit power comprises increasing the transmit power if a comparison of the first and the second gain relation is indicative of a smaller power amplification of the fed back second signal portion compared to the fed back first signal portion, or reducing the transmit power if the comparison is indicative of a larger power amplification of the fed back second signal portion compared to the fed back first signal portion.

7. The method of claim 1, further comprising:
adjusting parameters of a parametric gain model based on the first and second gain relations; and
applying the parametric gain model to adjust the transmit power of the transmit signal.

8. The method of claim 1, wherein the first signal portion is part of a preamble of a transmit data packet and the second signal portion is part of a payload the transmit data packet.

9. The method of claim 1, wherein the transmit signal is an OFDM signal.

10. A transmitter for transmitting a transmit signal comprising a first signal portion and a second signal portion, the transmitter comprising:
a power amplifier configured to amplify the transmit signal;
a transmit feedback receiver coupled to an output of the power amplifier and configured to feed back the transmit signal to generate a fed back first signal portion and a fed back second signal portion;
processing circuitry configured to determine a first gain relation between the fed back first signal portion and the first signal portion and to determine at least one second gain relation between the fed back second signal portion and the second signal portion; and
power adjustment circuitry configured to adjust a transmit power of the transmit signal according to a variation between the first gain relation and the second gain relation.

11. The transmitter of claim 10, further comprising:
a digital-to-analog converter configured to digital-to-analog convert a digital transmit signal to an analog transmit signal;
wherein the power amplifier configured to amplify the analog transmit signal to generate power amplified transmit signal;
wherein the transmit feedback receiver comprises an analog-to-digital converter configured to analog-to-digital convert the transmit signal fed back from the power amplifier to a fed back digital transmit signal.

12. The transmitter of claim 11, wherein the processing circuitry comprises digital baseband circuitry configured to determine the first and the second gain relation based on digital baseband samples of the digital transmit signal and the fed back digital transmit signal.

13. The transmitter of claim 10, wherein the first signal portion of the transmit signal comprises at least one training symbol and the second signal portion of the transmit signal comprises a plurality of payload symbols, wherein the processing circuitry comprises digital baseband circuitry and is configured to determine the first gain relation by relating a symbol power of a training symbol to a symbol power of a fed back training symbol, and to determine the second gain relation by relating a symbol power of a payload symbol to a symbol power of a corresponding fed back payload symbol.

14. The transmitter of claim 13, wherein the digital baseband circuitry is configured to determine the respective symbol powers by averaging corresponding digital baseband samples over a symbol duration.

15. The transmitter of claim 10, further comprising a modulator configured to modulate the transmit signal according to a modulation scheme with a symbol alphabet having $M \geq 64$ symbols.

16. The transmitter of claim 10, wherein a transmit symbol of the transmit signal comprises a cyclic prefix and wherein the transmitter is configured for a signal propagation delay of the transmit signal to the transmit feedback receiver smaller than a duration of the cyclic prefix.

17. The transmitter of claim 10, wherein the processing circuitry is configured to adjust parameters of a parametric gain model based on the determined first and the second gain relation, and wherein the power adjustment circuitry is configured to adjust the transmit power of the current payload signal portion based on the parametric gain model.

18. A transmitter for a wireless communication systems, the transmitter comprising:
transmitter front end circuitry configured to generate a digital transmit signal comprising a preamble signal portion and a payload signal portion;
a digital-to-analog converter configured to convert the digital transmit signal to an analog transmit signal;
a power amplifier configured to amplify the analog transmit signal;
a transmit feedback receiver coupled to an output of the power amplifier and configured to receive a fed back version of the transmit signal from the power amplifier,
wherein the transmit feedback receiver comprises an analog-to-digital converter configured to analog-to-digital convert the fed back version of the transmit signal to a fed back digital transmit signal comprising a fed back preamble signal portion and a fed back payload signal portion;
processing circuitry configured to determine a preamble signal power relation between the fed back preamble signal portion and the preamble signal portion and to determine at least one payload signal power relation between the fed back payload signal portion and the payload signal portion; and
power adjustment circuitry configured to adjust a power of a payload signal portion of the digital transmit signal according to a variation between the preamble signal power relation and the payload signal power relation.

19. The transmitter of claim 18, wherein the preamble signal portion of the digital transmit signal comprises at least one digital training symbol and the payload signal portion of the digital transmit signal comprises a plurality of digital payload symbols, wherein the processing circuitry comprises digital baseband circuitry configured to determine the preamble signal power relation by relating a symbol power of a digital training symbol to a symbol power of a fed back digital training symbol, and to determine the payload signal power relation by relating a symbol power of a digital payload symbol to a symbol power of a corresponding fed back digital payload symbol.

20. The transmitter of claim 18, wherein the transmitter is configured to transmit the transmit signal as an OFDM signal.

* * * * *